United States Patent
Heisig et al.

(10) Patent No.: US 8,070,356 B2
(45) Date of Patent: Dec. 6, 2011

(54) METHOD FOR THE TEMPERATURE MEASUREMENT OF SUBSTRATES, AND VACUUM PROCESSING APPARATUS

(75) Inventors: Andreas Heisig, Dresden (DE); Thomas Meyer, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 460 days.

(21) Appl. No.: 12/339,261

(22) Filed: Dec. 19, 2008

(65) Prior Publication Data

US 2009/0168837 A1  Jul. 2, 2009

(30) Foreign Application Priority Data

Dec. 19, 2007  (DE) .......................... 10 2007 061 777

(51) Int. Cl.
- *G01K 13/00* (2006.01)
- *G01K 1/14* (2006.01)
- *C23C 14/54* (2006.01)
- *G01J 5/00* (2006.01)

(52) U.S. Cl. .................................. 374/121; 204/298.03

(58) Field of Classification Search .................. 374/121; 204/298.03
See application file for complete search history.

(56) References Cited

U.S. PATENT DOCUMENTS

| 4,051,270 | A  | * | 9/1977 | Butler ............................... 427/8 |
| 5,504,302 | A  | * | 4/1996 | Hentze et al. ............ 219/121.12 |
| 5,820,266 | A  | * | 10/1998 | Fedak ............................. 374/179 |
| 6,190,040 | B1 | * | 2/2001 | Renken et al. ................. 374/185 |
| 6,231,933 | B1 | * | 5/2001 | Grant ............................. 427/565 |
| 6,236,021 | B1 | * | 5/2001 | Fair et al. ....................... 219/388 |
| 6,284,048 | B1 |  | 9/2001 | Van Bilsen et al. |
| 6,319,569 | B1 | * | 11/2001 | Callaway et al. ............ 427/585 |
| 6,651,488 | B2 | * | 11/2003 | Larson et al. ................ 73/61.62 |
| 6,660,090 | B2 | * | 12/2003 | Choy et al. ................... 118/624 |
| 7,733,090 | B2 | * | 6/2010 | Aoki ............................. 324/319 |
| 2006/0054087 | A1 | * | 3/2006 | Seo et al. ....................... 118/715 |
| 2007/0292598 | A1 | * | 12/2007 | Tada et al. ........................... 427/8 |
| 2011/0062611 | A1 | * | 3/2011 | Menary et al. ............... 264/40.1 |

FOREIGN PATENT DOCUMENTS

| DE | 3303227 A1 | * | 8/1984 |
| DE | 102 07 901 A1 | | 2/2002 |
| DE | 699 29 971 T2 | | 9/2006 |

* cited by examiner

*Primary Examiner* — Richard A. Smith

(74) *Attorney, Agent, or Firm* — Heslin Rothenberg Farley & Mesiti P.C.

(57) ABSTRACT

A method for measuring the temperature of substrates to be coated is disclosed. The substrates have an opening or a cavity, and the substrates are successively moved past a source of coating material. At least one substrate's temperature is measured during coating by at least one temperature sensor and the measured temperature value is transmitted to a measuring device. The temperature sensor is disposed inside the substrate's opening or cavity so as to prevent coating of the temperature sensor.

8 Claims, 2 Drawing Sheets

Figure 1:
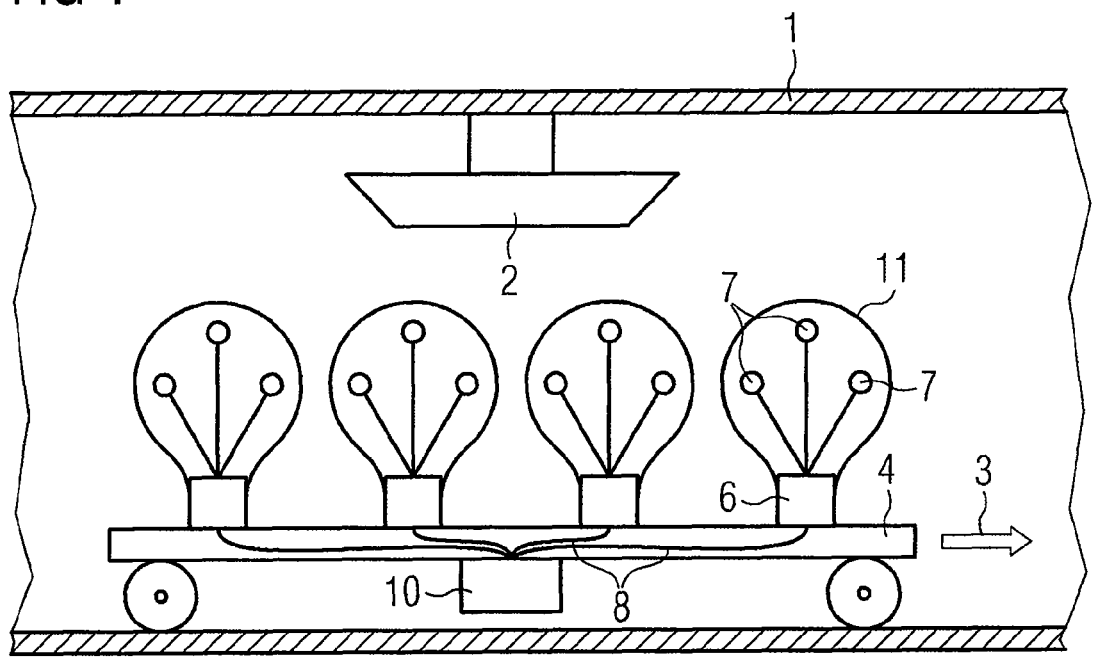

METHOD FOR THE TEMPERATURE MEASUREMENT OF SUBSTRATES, AND VACUUM PROCESSING APPARATUS

CROSS REFERENCE TO RELATED APPLICATIONS

This application claims priority of German application No. 10 2007 061 777.3 filed on Dec. 19, 2007, the entire disclosure of which is hereby incorporated herein by reference.

BACKGROUND ART

A method and a device for measuring the temperature of substrates to be coated in a vacuum coating apparatus are described hereafter.

Coating substrates in vacuum coating apparatuses, e.g., by sputtering, is known, the layer typically not exceeding a thickness of several micrometers, and a plurality of substrates being moved past a stationary coating source in sequence. As a function of the selected method and the coating material used, very high temperatures may occur during the coating process and act on the substrate to be coated. For example, temperatures of up to 600° C. may occur during the coating of glass substrates with molybdenum. To ensure high quality of the coating and for processing control, it is necessary to know the actual temperature of the substrates. The temperature measurement within the vacuum coating apparatus required for this purpose is frequently connected with difficulties, however. One problem, for example, is that temperature sensors which are attached on the surface of the substrate to be coated may unintentionally also be coated. In addition, the measured values are corrupted. One cause of this is the unintentional coating of the sensor itself, as already noted. A further cause may be seen in that both the temperature sensor itself and also the adhesive used for fastening it on the surface of the substrate generally absorb the existing heat radiation to a different extent than the substrate itself A method for producing a target for a sputter magnetron is known from DE 699 29 971 T2, in which a layer having a thickness of at least 3 mm is implemented at atmospheric pressure on the substrate by flame or plasma spraying, a tubular substrate being situated stationary in relation to the effective area of the spray gun and rotating around its longitudinal axis. A temperature measurement is performed in the interior of the tubular substrate.

Devices for depositing thin layers on the substrate by a CVD process, i.e., without a coating source, are known from DE 102 07 901 A1 and U.S. Pat. No. 6,284,048 B1, in which wafers are structured in a reactive gas atmosphere, one or more wafers being situated on a substrate holder situated so it is rotatable in the reactor housing and a temperature measurement being performed on the rear of the wafer.

For the coating of substrates in vacuum coating apparatuses, e.g., by sputtering, a plurality of substrates being moved past a stationary coating source in sequence, there is a need for a method for temperature measurement on the substrates to be coated, in which the actual temperature of the substrates is reliably ascertained and unintentional coating of the temperature sensor is avoided. Furthermore, a vacuum coating apparatus which is implemented to perform the suggested method is required.

BRIEF SUMMARY OF INVENTION

In a method for temperature measurement on a substrate to be coated, which has a cavity, in which a plurality of substrates are moved in sequence past a stationary coating unit, the temperature of the substrate is ascertained during the coating by a temperature sensor, and the temperature value thus ascertained is relayed to a measuring unit, it is suggested that the temperature sensor be situated in the cavity of the substrate in such a way that coating of the temperature sensor is prevented.

In this way, the disadvantages of the known methods described above are avoided, i.e., the temperature sensor is not subject to unintentional coating with coating material and the temperature of the substrate is ascertained with greater precision. Substrates of this type are, for example, Christmas tree ornaments, bottles, or tubes. As a function of the size of the particular substrate, it may be provided that multiple temperature sensors are situated inside the cavity to ascertain a temperature distribution over the surface of the substrate.

In one embodiment of the method, the temperature sensor may be situated without contact, i.e., at a distance to the side of the substrate facing away from the surface to be coated. An adhesive is required for this purpose to fasten the temperature sensor on the substrate. The precision of the measurement is also increased in this way, because the heat capacities of the temperature sensor itself and possibly of the adhesive are not able to corrupt the measuring result.

In another embodiment of the method, the temperature sensor may be situated on the side of the substrate facing away from the surface to be coated. The inertia of the measuring configuration is reduced by the direct contact between the temperature sensor and the substrate, which is caused in the event of a temperature sensor which is situated at a distance to the substrate in that first a thermal equilibrium must be implemented. The undesired influences of the heat capacities of the temperature sensor and possibly the adhesive used are less the greater the mass of the substrate in relation to the mass of the temperature sensor.

The temperature value ascertained by the temperature sensor may be relayed wirelessly to the measuring unit, for example. It is possible in this way to situate the measuring unit as stationary on a vacuum coating apparatus, in which the substrates are transported through the vacuum chamber during the coating.

Alternatively thereto, it may be provided that the temperature value ascertained by the temperature sensor is relayed by wire to the measuring unit, the relative configuration of the temperature sensor and the measuring unit to one another being kept constant. This means that the distance of the temperature sensor from the measuring unit does not change. In vacuum coating apparatuses in which the substrates are transported during the coating, this requires that the measuring unit is also transported through the vacuum chamber. For this purpose, the measuring unit may be mounted on a transport unit, for example, on which the substrates are mounted during the coating.

Transport units of this type may have substrate holders for fastening the substrates, for example. The temperature sensor may be situated on a substrate holder and the substrate to be coated may be fastened to the substrate holder before the beginning of the coating, so that the desired configuration of the temperature sensor in relation to the substrate is thus achieved. In other words: because the temperature sensor is fixed in relation to the substrate holder and the substrate is also fastened to the substrate holder, the position of the temperature sensor in relation to the substrate is also fixed. By the configuration of the temperature sensor on or at a distance to a surface of the substrate, which faces away from the surface to be coated, the temperature sensor is protected from unintentional coating. The temperature of the substrate may simultaneously be ascertained with greater precision from the side of the substrate facing away from the coating.

To perform the method described above, in a vacuum coating apparatus having a stationary coating unit and a transport unit for transporting a plurality of substrates past the coating unit, a device for temperature measurement on a substrate to be coated is also provided, which is explained in greater detail hereafter.

A device for temperature measurement on a substrate to be coated, which has a cavity, according to the method described above comprises a substrate holder for fastening the substrate, a temperature sensor for ascertaining the temperature of the substrate, and a measuring unit for receiving the ascertained temperature value from the temperature sensor, the temperature sensor being situated in relation to the substrate holder in such a way that the temperature sensor is situated in the cavity of the substrate when the substrate is fastened on the substrate holder.

The temperature sensor may be fastened on the substrate holder. Alternatively, the temperature sensor may be situated on a transport unit, which also comprises the substrate holder(s), in a position fixed in relation to the substrate holder. Multiple temperature sensors may be provided on each substrate holder as a function of the size of the substrate and its cavity. The temperature sensors may be implemented for wireless transmission of the ascertained temperature values to a measuring unit.

BRIEF DESCRIPTION OF THE DRAWING FIGURES

Figure 2:
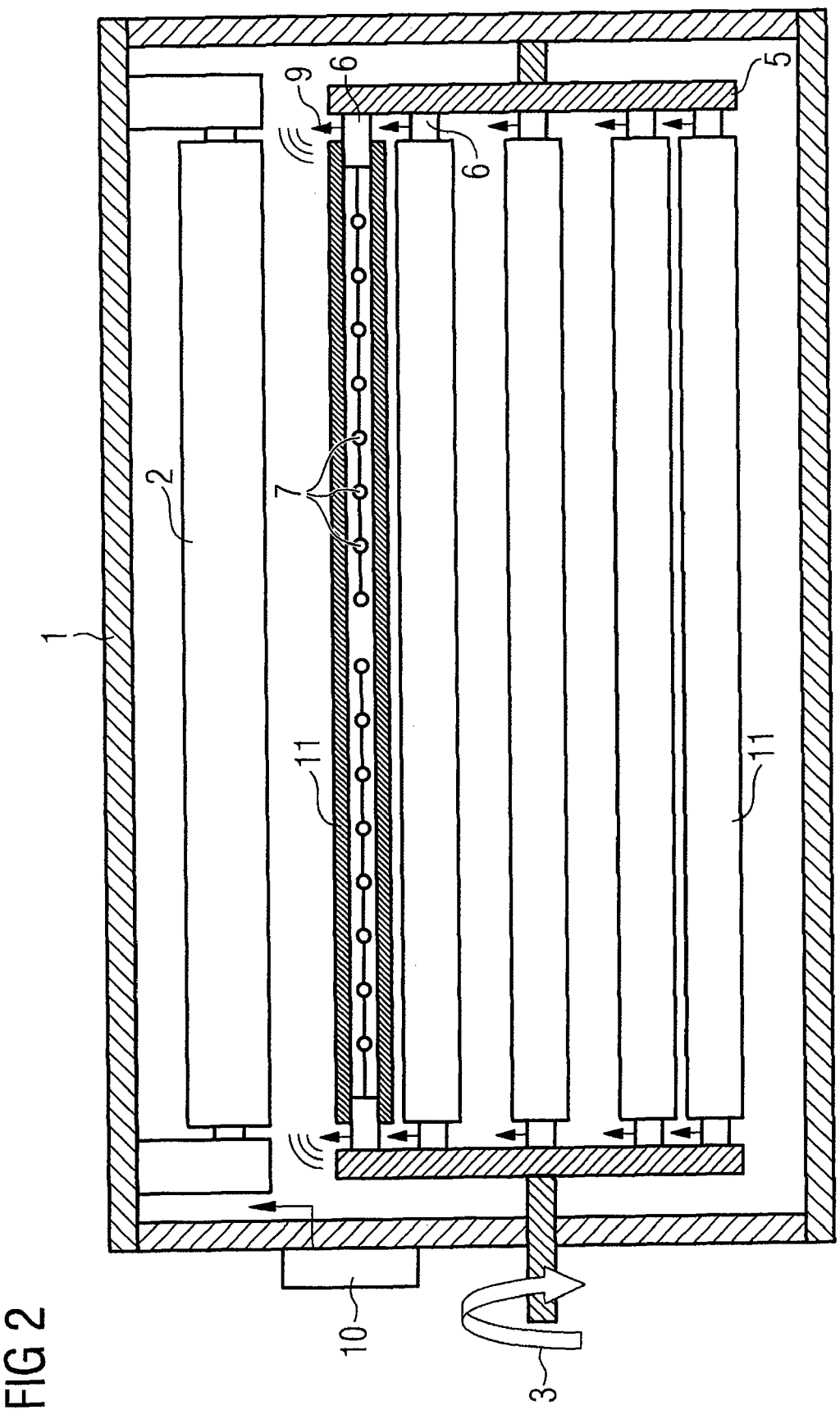

The device for performing the described method is explained in greater detail hereafter on the basis of exemplary embodiments and associated drawings. In the figures:

FIG. 1 shows a device for coating glass bulbs,
FIG. 2 shows a device for coating a tubular substrate.

DETAILED DESCRIPTION

In the exemplary embodiment shown in FIG. 1, a transport unit is moved along the transport direction 3, shown by the arrow, through the vacuum chamber 1 of a vacuum coating apparatus, in which a coating unit 2 is situated. The coating unit 2 is a planar magnetron in the exemplary embodiment. The transport unit comprises a transport carriage 4, on whose top side multiple substrate holders 6 are situated and on whose bottom side a measuring unit 10 is situated. Multiple temperature sensors 7, which are connected to the measuring unit 10 by cables 8, are fastened to each substrate holder 6. The substrate holders 6 are each implemented to accommodate one glass bulb 11. The glass bulbs 11 are the substrates to be coated. The substrates 11 are fastened to the particular substrate holders 6 in such a way that the temperature sensors 7 are situated in the cavity of the substrate 11 and ascertain the temperature of the particular substrate 11 without contact in this way.

A further exemplary embodiment is shown in FIG. 2, in which tubular substrates 11 are coated in the vacuum chamber 1 of a vacuum coating apparatus. A coating unit 2, which is a rotating tubular magnetron in the exemplary embodiment, is situated in the interior of the vacuum chamber 1. The substrates 11 are fastened to a transport unit, which allows a rotating transport of the substrates 11 in the direction 3, shown by the arrow, past the coating unit 2, and in addition, each substrate 11 rotating around its own axis. The transport unit comprises two carrier disks 5 situated so they are rotatable at opposing ends of the vacuum chamber 1, each of which has a plurality of substrate holders 6. A tubular substrate 11 is connected at one of its ends to one substrate holder 6 of the two carrier discs 5 in each case. A configuration of multiple temperature sensors 7 is fastened to each substrate holder 6, which are situated in such a way that they are situated one behind another in the interior of the tubular substrate 11 when the substrate 11 is fastened on the transport unit. The temperature of the substrate 11 may thus be ascertained without contact at multiple points. The substrate holders 6 each have a transmitter 9 for wireless transmission of the ascertained temperature values to the measuring unit 10 situated outside the vacuum chamber 1.

The invention claimed is:

1. A method for vacuum coating substrates, which are to be coated and have a cavity, in which a plurality of the substrates are moved past a stationary coating unit in sequence, comprising: ascertaining a temperature value of at least two respective substrates of said plurality during the coating by at least one temperature sensor associated with each respective substrate, and relaying a temperature value thus ascertained to a measuring unit, the at least one temperature sensor being situated in the cavity of a respective substrate in such a way that coating of the at least one temperature sensor is precluded.

2. The method according to claim 1, wherein the at least one temperature sensor is situated at a distance away from a side of the respective substrate, which faces away from a surface to be coated.

3. The method according to claim 1, wherein the at least one temperature sensor is situated on a side of the respective substrate which faces away from a surface to be coated.

4. The method according to claim 1, wherein the temperature value ascertained by the at least one temperature sensor is relayed wirelessly to the measuring unit.

5. The method according to claim 1, wherein the temperature value ascertained by the at least one temperature sensor is relayed via wire to the measuring unit, a relative configuration of the at least one temperature sensor and the measuring unit to one another being kept constant.

6. The method according to claim 1, wherein the at least one temperature sensor is situated on a substrate holder, and the respective substrate to be coated is fastened to the substrate holder before beginning of the coating, so that a desired configuration of the at least one temperature sensor in relation to the respective substrate is thus achieved.

7. A vacuum coating apparatus having a stationary coating unit, a transport unit for transporting a plurality of substrates past the coating unit, and at least one temperature sensor provided on each respective substrate of at least two substrates of the plurality of substrates to be coated, the at least two substrates each having a cavity, comprising a substrate holder for fastening the at least two substrates, the at least one temperature sensor on each respective substrate ascertaining a temperature value of the respective substrate, and a measuring unit for receiving an ascertained temperature value from each temperature sensor, each temperature sensor being situated in relation to the substrate holder in such a way that the temperature sensor is situated in the cavity of the respective substrate when the respective substrate is fastened on the substrate holder.

8. The vacuum coating apparatus according to claim 7, wherein the at least one temperature sensor is fastened on the substrate holder.

* * * * *

UNITED STATES PATENT AND TRADEMARK OFFICE
CERTIFICATE OF CORRECTION

| | | |
|---|---|---|
| PATENT NO. | : 8,070,356 B2 | Page 1 of 1 |
| APPLICATION NO. | : 12/339261 | |
| DATED | : December 6, 2011 | |
| INVENTOR(S) | : Heisig et al. | |

It is certified that error appears in the above-identified patent and that said Letters Patent is hereby corrected as shown below:

Column 2, Line 20: Delete "adhesive is required" and insert -- adhesive is not required --

Signed and Sealed this
Twelfth Day of June, 2012

David J. Kappos
*Director of the United States Patent and Trademark Office*